(12) United States Patent
Kim

(10) Patent No.: US 6,737,657 B2
(45) Date of Patent: May 18, 2004

(54) ION IMPLANTING APPARATUS FOR MANUFACTURING SEMICONDUCTOR DEVICES

(75) Inventor: Sang-Kee Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/608,339

(22) Filed: Jun. 30, 2003

(65) Prior Publication Data

US 2004/0056214 A1 Mar. 25, 2004

(30) Foreign Application Priority Data

Sep. 19, 2002 (KR) ................ 10-2002-0057188

(51) Int. Cl.[7] ................................. G21K 5/10
(52) U.S. Cl. ................................. 250/492.2
(58) Field of Search ........................ 250/492.2

(56) References Cited

U.S. PATENT DOCUMENTS 5,414,356 A * 5/1995 Yoshimura et al. ......... 324/239
2002/0125829 A1 * 9/2002 Vella ..................... 315/111.81

* cited by examiner

Primary Examiner—John R. Lee
Assistant Examiner—James J. Leybourne
(74) Attorney, Agent, or Firm—Volentine Francos, PLLC

(57) ABSTRACT

An ion implanting apparatus includes an analyzer unit for analyzing ions to be implanted into a wafer from among those ions in a beam produced by an ionization, a vacuum unit for producing a vacuum in the analyzer unit, a vacuum gauge for measuring the pressure inside the analyzer unit, and a shield for preventing a magnetic field employed by the analyzer unit from affecting the vacuum gauge. The shield has a plurality of magnetic field shielding plates encircling the vacuum gauge and dielectric material inserted between the magnetic shielding plates. The shield prevents the vacuum gauge from being influenced by the magnetic field generated by the analyzer unit. Therefore, the vacuum level inside the analyzer unit can be precisely measured.

11 Claims, 5 Drawing Sheets

ION IMPLANTING APPARATUS FOR MANUFACTURING SEMICONDUCTOR DEVICES

BACKGROUND OF THE INVENTION

1. Field of the Invention

The present invention relates to an apparatus for manufacturing semiconductor devices. More particularly, the present invention relates to an ion implanting apparatus for manufacturing semiconductor devices.

2. Description of the Related Art

In a typical ion implanting process, P-type impurities such as boron (B), aluminum (Al) and indium (In), and N-type impurities such as antimony (Sb), phosphorus (P) and arsenic (As), are used to form a plasma ion beam. A semiconductor wafer is irradiated with the ion beam so that the impurities are implanted into crystalline structures of the wafer to produce desired levels of conductivity and resistivity in the implanted areas. The ion implanting process has widely been used in the manufacturing of semiconductor devices because it allows the concentration of the implanted impurities and hence, the levels of conductivity and resistivity, to be readily controlled.

The ion implanting apparatus generally includes an ionization unit, an analyzer unit, an acceleration unit, a focusing unit, a scanning unit, an implanting chamber, and a vacuum chamber.

However, processing defects may be caused by even fine particles in the ion implantation process. Accordingly, a very significant aspect of the process entails maintaining a high vacuum state within the wafer processing chamber. To this end, a vacuum gauge is used to measure the vacuum levels in the ionization unit, the analyzer unit, and the wafer processing chamber during the ion implanting process. An ionization vacuum gauge is mainly used as such a vacuum gauge. The ionization vacuum gauge measures the flow of positive ions ionized by electron collision (i.e., the gauge measures current). Ionization vacuum gauges may be classified as hot cathode ion gauges (HCIG) and cold cathode ion gauges (CCIG).

The analyzer unit analyzes positive ions having only a certain atomic weight by employing the operating principle of a mass spectrometer. The analyzer unit has a magnet to establish a magnetic field in proportion to the magnitude of current applied to the analyzer unit. The magnitude of the current is varied based on the type of ion. For example, in the case of boron (B) having an atom weight of "11", current of 28–29A is supplied. In the case of phosphorus (P) having an atomic weight of "31", current of 121–122A is supplied. Accordingly, when the ion to be analyzed is arsenic (As) having an atomic weight of "75", a magnetic field of a very large magnitude is provided.

The magnetic field established by the magnet of the mass analyzer has an influence on the magnetic field in the cold cathode ion gauge for measuring the vacuum level inside the analyzer unit. If the magnetic field lines are in opposite directions, the cold cathode ion gauge is too unstable to be read correctly. If the magnetic field lines are in the same direction, the value read by the cold cathode ion gauge fluctuates so widely that the measured vacuum level is utterly unreliable. Furthermore, the superimposed magnetic fields cause the positive ions to deposit rapidly on the negative electrode of the cold cathode ion gauge, thereby reducing the lifespan of the cold cathode ion gauge.

SUMMARY OF THE INVENTION

An object of the present invention is to provide an ion implanting apparatus and in particular, a vacuum gauge for use therein, that is free of the problems and drawbacks of the prior art.

More specifically, one object of the present invention is to provide an ion implanting apparatus in which the vacuum level inside an analyzer unit may be measured without being influenced by a magnetic field generated by a magnet of the analyzer unit.

Another object of the present invention is to provide an ion implanting apparatus in which a large magnetic field may be established in a cold cathode ion gauge and yet the ions are not deposited rapidly onto an electrode of the cold cathode ion gauge, whereby the cold cathode ion gauge retains a long the lifespan.

To achieve these objects, the present invention provides the combination of a vacuum gauge for use in measuring the level of a vacuum within analyzer unit of an ion implanting apparatus, and a magnetic field shield for the vacuum gauge.

According to one aspect of the present invention, an ion implanting apparatus includes an ionization unit operative to produce an ion beam, an analyzer unit connected to said ionization unit downstream thereof in the apparatus and operative to analyze ions of the beam that are to be implanted into the substrate, a vacuum unit connected to the analyzing unit so as to create a vacuum within the analyzing unit, an implanting chamber connected to the analyzer unit downstream thereof in the apparatus, and the aforementioned vacuum gauge and shield for shielding the vacuum gauge from an external magnetic field such as that generated by a magnet of the analyzer unit.

The magnetic field shield has a plurality of shielding plates encircling the vacuum gauge, and dielectric material interposed between the shielding plates. Preferably, the shield is a cylindrical member. Also, the shield preferably has three concentric shielding plates.

DETAILED DESCRIPTION OF THE PREFERRED EMBODIMENTS

Figure 1:
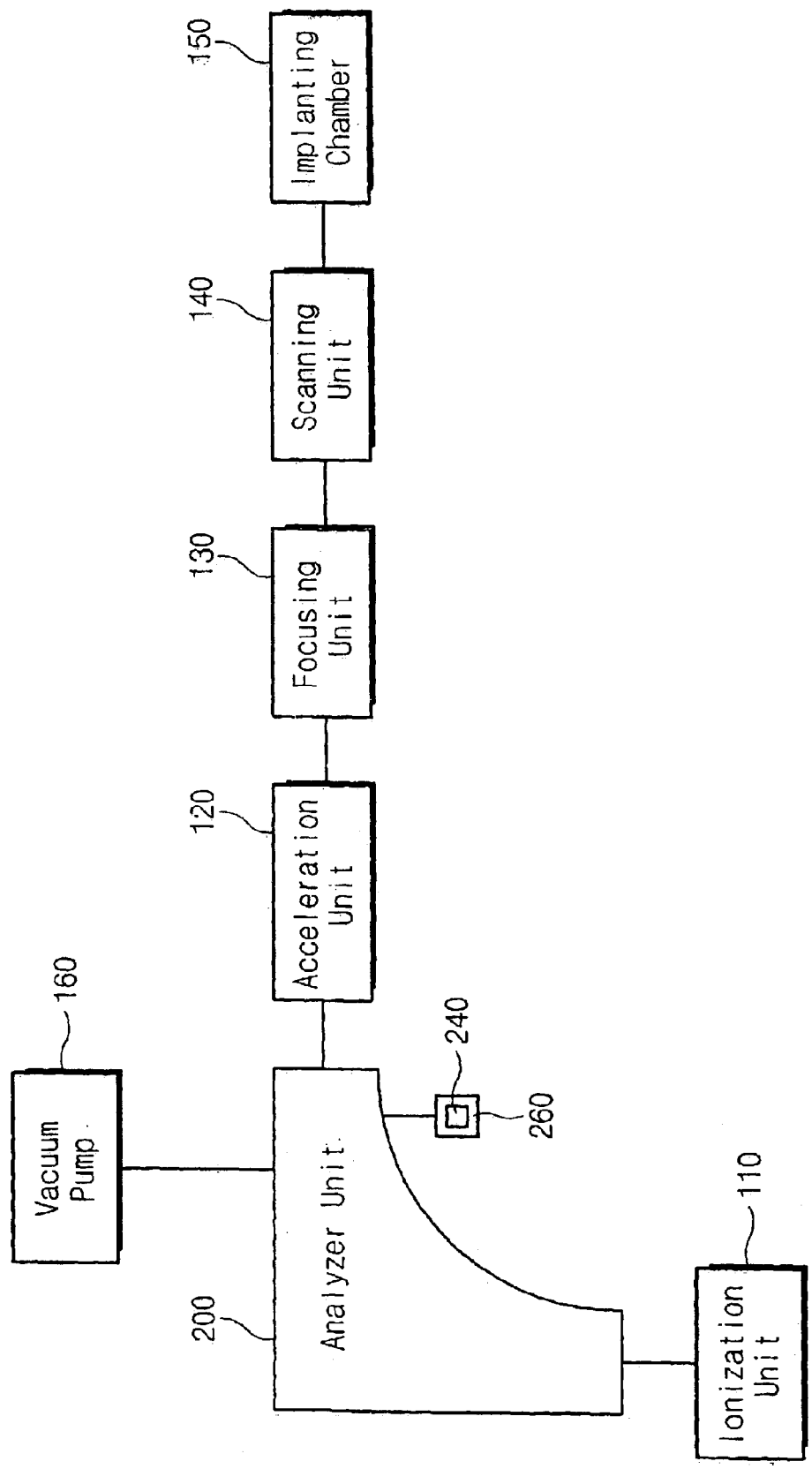
FIG. 1 is a schematic diagram of an ion implanting apparatus according to the present invention.

An ion implanting apparatus according to the present invention will now be generally described below with reference to FIG. 1.

The ion implanting apparatus includes an ionization unit 110, an analyzer unit 200, an acceleration unit 120, a focusing unit 130, a scanning unit 140, an implanting chamber 150, and a vacuum pump 160.

The ionization unit 110 produces ions, and the analyzer unit 200 analyzes ions to be implanted into a wafer from among the ions produced by the ionization unit 110 by employing the operating principle of a mass spectrometer. The analyzer unit 200 will be described in more detail with reference to FIG. 2.

The analyzer unit 200 is a mass analyzer that defines a tunnel having a small height and width. The central portion of the analyzer unit 200 has a constant radius of curvature, in which the direction of the ion beam is changed. A magnet 220 disposed on the outside of the tunnel causes ions that are unfit for implantation to remain in the tunnel as the ion beam produced by the ionization unit 110 passes through the tunnel. The magnitude of current supplied to the analyzer unit 200 is varied based on the atomic weight of the ion to be analyzed. That is, the larger the atomic weight of the ion to be analyzed is, the higher is the magnitude of the current supplied to the analyzer unit 200.

Referring again to FIG. 1, the acceleration unit 120 accelerates the analyzed ions to provide the ions with enough energy to implant them into a wafer to a desired depth. The focusing unit 130 focuses the ion beam to prevent the ion beam from being split apart by repulsive forces exerted by the ions, namely by positive ions that agglomerate when ionized neutral atoms migrate. The scanning unit 140 moves the ion beam up and down and to the left and right so as to distribute the ion beam uniformly over the wafer. The ions are implanted into the wafer within the implanting chamber 150. The vacuum pump 160 maintains a vacuum inside the analyzer unit 200.

Figure 2:
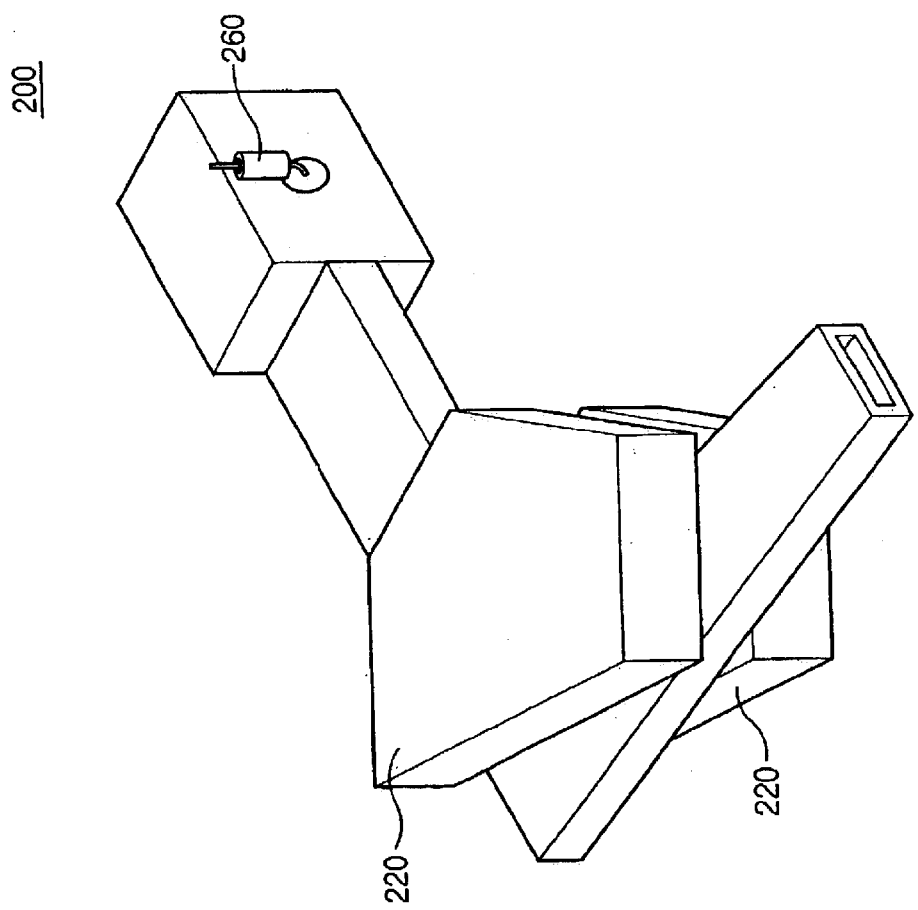
FIG. 2 is a perspective view of an analyzer unit of the ion implanting apparatus shown in FIG. 1.
Figure 3:
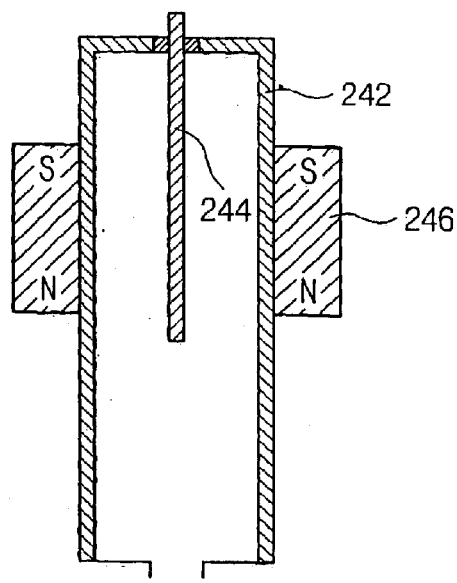
FIG. 3 is a cross-sectional view of a vacuum gauge according to the present invention.

As shown in FIG. 2, a cold cathode ion gauge is disposed at one side the analyzer unit 200. The cold cathode ion gauge is a vacuum gauge for measuring the level of the vacuum inside the analyzer unit 200. The cold cathode ion gauge will now be described in detail with reference to FIG. 3.

The cold cathode ion gauge includes a cathode 242, an anode 244, and a permanent magnet 246. The cathode 242 is a cylindrical electrode having one end communicating with the analyzer unit 200. The anode 244 is a cylindrical electrode that is coaxial with the cathode 242 and is inserted into the cathode 242 as spaced a predetermined distance away from an inner wall thereof. A high voltage is applied to the cathode 242 and the anode 244, causing electrons to migrate from the negative electrode to the positive electrode.

The permanent magnet 246 is disposed around the cathode 242 so as to establish a magnetic field that is parallel with the longitudinal axes of the electrodes. Due to the magnetic field, the electrons migrate to the positive electrode within a constant orbit, i.e., not in a linear direction. This increases the probability that these electrons collide against gas molecules situated between the cathode 242 and the anode 244, and leads to improvement in production of positive ions. The produced positive ions migrate to the negative electrode, which migration is measured as the magnitude of the current. The pressure within the gauge can be estimated because the magnitude of the current is proportional to the number of gas molecules and the volume of gas is measurable.

Figure 4:
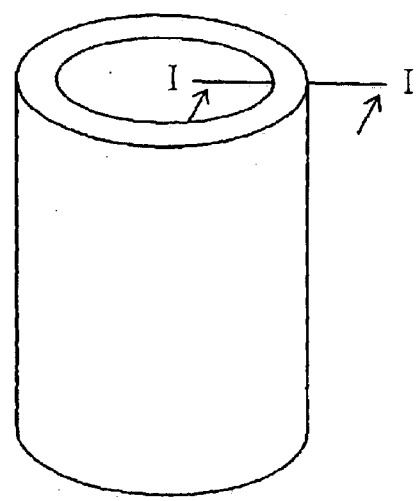
FIG. 4 is a perspective view of a magnetic field shield according to the present invention.

The permanent magnet 246 of the cold cathode ion gauge 240 must establish a magnetic field having a constant magnitude during an ion implanting process. This is because the accuracy of the cold cathode ion gauge 240 is reduced by variations in the magnitude of the magnetic field. However, a very large magnetic field generated by the magnet 220 of the analyzer unit 200 would affect the magnetic field in the cold cathode ion gauge 240. To circumvent this potential problem, the ion implanting apparatus according to the invention has a magnetic field shield 260. Magnetic field shields according to the present invention will now be described with reference to FIG. 4, FIG. 5A and FIG. 5B.

The magnetic field shield 260 is a tubular member into which the cold cathode ion gauge 240 is inserted. Preferably, the magnetic field shield 260 is cylindrical because a polygonal member may facilitate arcing at the angled intersections of its side walls. The shield 260 has an inner wall 261 and an outer wall 262 which are made of stainless steel.

Figure 5A:
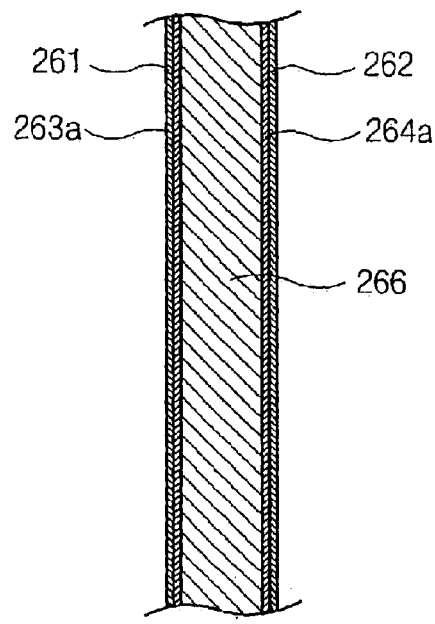
FIG. 5A is a cross-sectional view of an embodiment of the magnetic field shield, taken along line I—I of FIG. 4.

The shield 260 may also include a first magnetic field shielding plate 263a and a second magnetic field shielding plate 264a, as shown in FIG. 5A. The first and second magnetic field shielding plates 263a and 264a are cylindrical and coaxial with each other. The first magnetic field shielding plate 263a is attached to the inner wall 261, and the second magnetic field shielding plate 264a is attached to the outer wall 262 such that a predetermined space exists between the first and second magnetic field shielding plates 263a and 264a. A high-k dielectric substance 266 is inserted into the predetermined space in order to enhance the magnetic shielding effect.

Figure 5B:
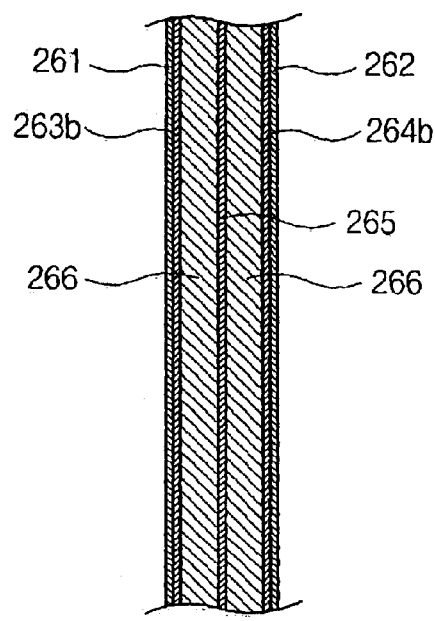
FIG. 5B is a cross-sectional view of another embodiment of the magnetic field shield, taken along line I—I of FIG. 4.

In the embodiment of FIG. 5B, the shield 260 includes a first magnetic field shielding plate 263b attached to the inner wall 261, a second magnetic field shielding plate 264b attached to the outer wall 262, and a third magnetic field shielding plate 265 interposed between the first and second magnetic shielding plate 263b and 264b. Preferably, the third magnetic field shielding plate 265 is disposed midway between the first and second magnetic field shielding plates 263b and 264b. These plates 263b, 264b, and 265 are concentric circle and are spaced apart by predetermined distances. A dielectric substance 266 is inserted into the space between the first and third magnetic field shielding plates 263b and 265 and into the space between the third and second magnetic field shielding plates 265 and 264b. The dielectric substance 266 between the first and third magnetic field shielding plates 263b and 265 may be the same as or different from the dielectric substance 266 between the third and second magnetic field shielding plates 265 and 264b.

Figure 6:
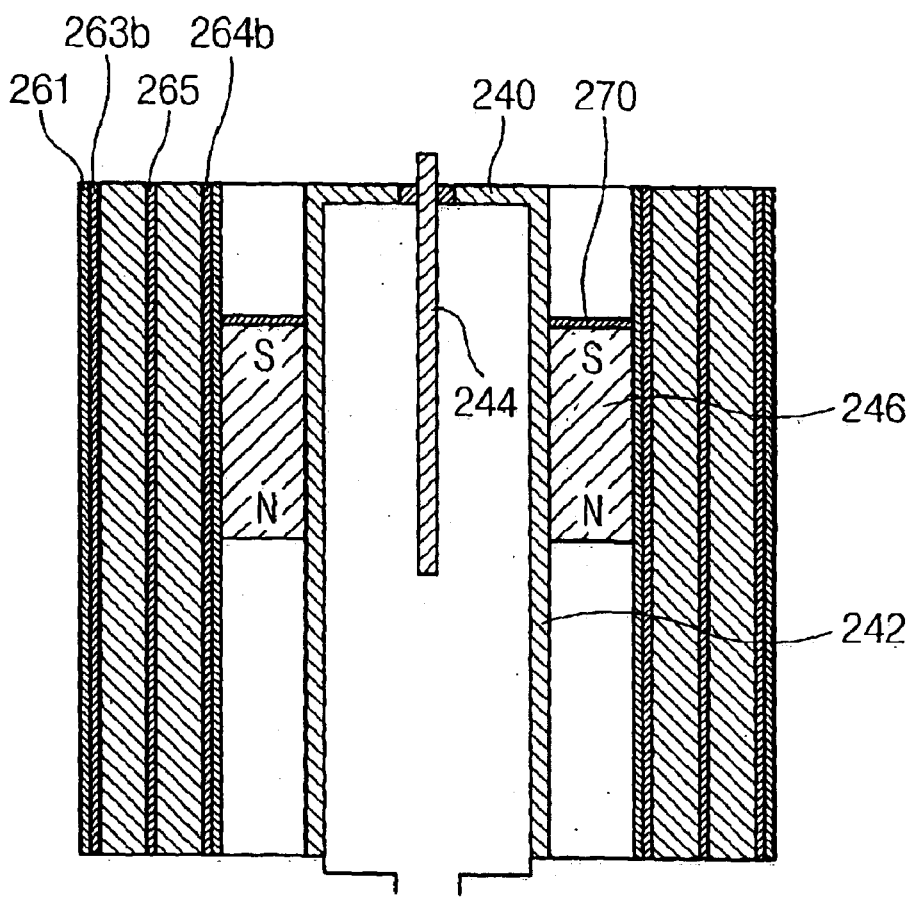
FIG. 6 is a cross-sectional view of a cold cathode ion gauge and the magnetic field shield as coupled to each other.

FIG. 6 shows the cold cathode ion gauge 240 and the shield 260 coupled to each other. The shield 260 has an inner diameter that is equal to or larger than the outside diameter of the permanent magnet 246 of the cold cathode ion gauge 240. A stopper 270 is installed in the shield 260 to prevent the shield 260 from falling off of the cold cathode ion gauge 240 when the cold cathode ion gauge 240 is oriented vertically in the apparatus.

The magnetic field established in the cold cathode ion gauge 240 is always constant because the magnetic field shield 260 extends around the circumference of the cold cathode ion gauge 240. Therefore, the vacuum level inside of the analyzer unit 200 can be precisely measured.

In the present invention, the magnetic field shield 260 has been described as comprising two or three magnetic field shielding plates. These plates may be made of any material suitable for offering a shield against a magnetic field. Moreover, any number of magnetic field shielding plates may employed by the shield 260—the greater the number of magnetic field shielding plates there are, the less the magnetic field generated by the magnet of the analyzer will influence the reading of the cold cathode ion gauge.

Finally, although the present invention has been described with respect to the preferred embodiments thereof, various modifications as will occur to those skill in the art can be made to the preferred embodiments without departing from the true spirit and scope of the invention as defined by the appended claims.

What is claimed is:

1. An ion implanting apparatus for implanting ionized impurities into a semiconductor substrate, the ion implanting apparatus comprising:

an ionization unit operative to produce an ion beam;

an analyzer unit connected to said ionization unit downstream thereof in the apparatus such that the ion beam produced by the ionization unit passes through the analyzer unit, said analyzer unit operative to discriminate ions that are to be implanted into the substrate;

an implanting chamber connected to said analyzer unit downstream thereof in the apparatus and in which the ions are implanted into the substrate;

a vacuum unit including a vacuum pump connected to said analyzing unit so as to create a vacuum within the analyzing unit;

a vacuum gauge connected to said analyzing unit so as to measure the level of the vacuum within the analyzer unit; and a magnetic field shield comprising a plurality of magnetic field shielding plates extending around said vacuum gauge, and dielectric material interposed between said magnetic field shielding plates, whereby the vacuum gauge is shielded from an external magnetic field.

2. The ion implanting apparatus of claim 1, wherein said vacuum gauge is a cold cathode ion gauge comprising an anode, a cathode spaced from said anode, and a permanent magnet oriented to generate a magnetic field whose field lines extend between said anode and said cathode.

3. The ion implanting apparatus of claim 1, wherein said magnetic field shielding plates are cylindrical and concentric.

4. The ion implanting apparatus of claim 1, wherein said magnetic field shield is a cylindrical member.

5. The ion implanting apparatus of claim 1, wherein said plurality of magnetic field shielding plates comprise a first magnetic field shielding plate encircling said vacuum gauge, a second magnetic field shielding plate encircling said first magnetic field shielding plate, and a third magnetic field shielding plate encircling second magnetic field shielding plate, and said dielectric material is interposed between the first and third magnetic field shielding plates and between the second and third magnetic field shielding plates.

6. The ion implanting apparatus of claim 1, wherein said analyzer unit comprises a magnet.

7. The combination of a vacuum gauge for use in measuring the level of a vacuum within an analyzer unit of an ion implanting apparatus, and a magnetic field shield for the vacuum gauge, wherein said vacuum gauge comprises a permanent magnet, and said magnetic field shield comprises a plurality of magnetic field shielding plates each extending around said vacuum gauge, and dielectric material interposed between said magnetic field shielding plates.

8. The combination of claim 7, wherein said vacuum gauge is a cold cathode ion gauge and further comprises an anode and a cathode spaced from said anode, and said permanent magnet is oriented to generate a magnetic field whose field lines extend between said anode and said cathode.

9. The combination of claim 7, wherein said magnetic field shielding plates are cylindrical and concentric.

10. The combination of claim 7, wherein said magnetic field shield is a cylindrical member.

11. The combination of claim 7, wherein said plurality of magnetic field shielding plates comprise a first magnetic field shielding plate encircling said vacuum gauge, a second magnetic field shielding plate encircling said first magnetic field shielding plate, and a third magnetic field shielding plate encircling second magnetic field shielding plate, and said dielectric material is interposed between the first and third magnetic field shielding plates and between the second and third magnetic field shielding plates.

* * * * *